United States Patent
Khosla et al.

Patent Number: 5,966,623
Date of Patent: Oct. 12, 1999

[54] METAL IMPURITY NEUTRALIZATION WITHIN SEMICONDUCTORS BY FLUORINATION

[75] Inventors: Rajinder P. Khosla, Ithaca; Liang-Sun Hung, Webster, both of N.Y.

[73] Assignee: Eastman Kodak Company, Rochester, N.Y.

[21] Appl. No.: 08/639,543

[22] Filed: Apr. 29, 1996

Related U.S. Application Data

[60] Provisional application No. 60/007,037, Oct. 25, 1995.

[51] Int. Cl.$^6$ .................................................. H01L 21/425
[52] U.S. Cl. ........................ 438/471; 438/473; 438/477; 438/528; 438/795
[58] Field of Search .................. 438/471, 473, 438/477, 402, 310, 58, 476, 565, 143, 528, 906, 909, 974, FOR 144, FOR 145, FOR 146, FOR 158, 795

[56] References Cited

U.S. PATENT DOCUMENTS

| | | |
|---|---|---|
| 3,556,879 | 1/1971 | Mayer ................................. 4328/477 |
| 4,159,917 | 7/1979 | Gluck .................................... 438/477 |
| 4,231,809 | 11/1980 | Schmidt ................................ 438/473 |
| 5,028,560 | 7/1991 | Tsukamoto et al. ................. 438/482 |
| 5,174,881 | 12/1992 | Iwasaki et al. ...................... 156/345 |
| 5,223,445 | 6/1993 | Fuse .................................... 438/528 |
| 5,225,355 | 7/1993 | Sugino et al. ....................... 438/473 |
| 5,238,871 | 8/1993 | Sato .................................... 438/477 |
| 5,296,411 | 3/1994 | Gardner et al. ..................... 438/476 |
| 5,506,178 | 4/1996 | Suzuki et al. ....................... 438/477 |
| 5,529,937 | 6/1996 | Zhang et al. ........................ 438/476 |
| 5,554,883 | 9/1996 | Kuroi .................................. 438/528 |
| 5,578,133 | 11/1996 | Sugino et al. ...................... 438/477 |
| 5,656,516 | 8/1997 | Suzuki ................................ 438/773 |
| 5,750,435 | 5/1998 | Pan ..................................... 438/528 |

Primary Examiner—Savitri Mulpuri
Attorney, Agent, or Firm—James D. Leimbach

[57] ABSTRACT

Fluorination can be used to neutralize transition metal impurities in Si. Fluorine is incorporated into the near-surface region of Si by implantation or annealing in a fluorine containing ambient. Thermal treatments at appropriate temperatures are used to initiate the interdiffusion and reaction between fluorine and metal contaminants. The impurities readily react with fluorine to form a compound or complex, thus significantly reducing the number of mid-gap impurities.

11 Claims, 1 Drawing Sheet

METAL IMPURITY NEUTRALIZATION WITHIN SEMICONDUCTORS BY FLUORINATION

CROSS REFERENCE TO RELATED APPLICATION

Reference is made to and priority claimed from U.S. Provisional Application Ser. No. 60/007,037, filed Oct. 25, 1995, entitled IMPURITY NEUTRALIZATION WITHIN SEMICONDUCTORS BY FLUORINATION.

FIELD OF INVENTION

The invention pertains to a method of reducing detrimental effects of metal impurities on semiconductor devices and more particularly to passivation or neutralization of metal impurities in Si by fluorination.

BACKGROUND OF THE INVENTION

Transition metals are fast diffusing species in Si and readily incorporated during various stages of device processing. The impurities and metal-related defects may act as recombination centers in devices, and thereby cause low yields and poor reliability. Efforts undertaken to reduce the effects of metal contamination have involved two approaches: 1) removal of device degrading impurities from the active device regions by gettering and 2) deep-level passivation by hydrogenation.

Gettering processes are divided into two categories: intrinsic and extrinsic. Intrinsic gettering is based on the fact that under proper conditions supersaturated oxygen in silicon wafers will precipitate, and the stress resulting from precipitation will induce stacking faults and dislocation loops. These dislocations become sites at which unwanted impurities can be trapped and localized. Extrinsic gettering involves the use of external means to create the damage or stress in a silicon lattice that leads to the creation of the extended defects or chemically reactive sites at which the mobile impurities are captured. Extrinsic gettering has been accomplished by utilizing phosphorus diffusion and backside damage introduced by abrasion or ion implantation. High-temperature anneals in chlorine have also been utilized to enhance minority carrier lifetimes. Possible mechanisms include formation of volatile metal chlorides allowing metal ion removal from wafers.

Considerable recent interest has been shown in the passivation of electrically active defects associated with metal contaminants by reaction with atomic hydrogen. Typically the passivation of impurities is achieved by exposing the Si wafer to a low pressure (0.1–0.5 Torr) RF hydrogen plasma at 100–400° C.

Although gettering and passivation with atomic hydrogen are used to reduce detrimental effects of metal impurities on devices, they have their own limitation. For instance, iron is the most common and detrimental impurity, but the species is only weakly gettered by typical wafer getting and remains almost intact upon hydrogenation.

The gettering by chlorine is generally carried out at a temperature above 800° C. in order to convert a deleterious metal to the metal halide and to volatilize the halide at the exposed surface. The effectiveness of the method is largely dependent on the volatility of the metal chlorides. Moreover since chlorine is immobile, the method is not applicable to a large number of metal species which have low diffusion coefficient at the processing temperature. The corrosive nature of HCl is another drawback and led to consideration of other Cl containing materials as alternative. These gases, however, introduce their own problems. For example, TCE is a known cancer causing agent, while TCA reacts to form phosgene, $COCl_2$, a deadly gas.

In contrast to chlorine, hydrogen is extremely mobile, and thus hydrogenation can be carried out at relatively low temperatures. However, the passivation process is not stable, as indicated by the observation that subsequent heating a passivated wafer at temperatures above 400° C. causes a reappearance of the defect states because of the unstable nature of the hydrogen-impurity pairing. It has also been reported that hydrogen not only passivates the detrimental impurities, but also deactivates shallow dopants. For instance, the spreading resistance of a boron-doped Si wafer increases dramatically when the wafer is exposed to atomic hydrogen. It is, therefore, not desirable in Si integrated circuits.

From the foregoing discussion it should be apparent that there is a need within the art for improved techniques for passivating metal impurities within semiconductor materials.

SUMMARY OF THE INVENTION

In this invention fluorination is used to neutralize the transition metal impurities in Si. Fluorine is incorporated into the near-surface region of Si by implantation or annealing in a fluorine containing ambient. Thermal treatments at appropriate temperatures are used to initiate the interdiffusion and reaction between fluorine and metal contaminants. The impurities readily react with fluorine to form a compound or complex, thus significantly reducing the number of mid-gap impurities.

The present invention is directed to overcoming one or more of the problems set forth above. Briefly summarized, according to one aspect of the present invention, a technique for neutralizing transition metal defects within silicon based semiconductors comprising the steps of providing a semiconductor wafer having a substrate with a surface containing etched circuitry using etching methods common within the semiconductor industry, placing the wafer into a chamber, neutralizing transition metal impurities in the semiconductor by incorporating fluorine into at least the surface of the semiconductor containing circuitry, and thermally treating the semiconductor wafer at predetermined temperatures to initiate interdiffusion and reaction between fluorine and metal contaminants.

The above and other objects of the present invention will become more apparent when taken in conjunction with the following description and drawings wherein identical reference numerals have been used, where possible, to designate identical elements that are common to the figures.

ADVANTAGEOUS EFFECT OF THE INVENTION

The advantages of fluorination over chlorination are illustrated as follows. (1) The enthalpy of a metal-fluoride is substantially greater than that of its corresponding chloride. As a result, the reaction of metal contaminants with fluorine is more thermodynamically favorable than that with chlorine, and the reaction can occur at a lower temperature and/or at a lower concentration. (2) Fluorine is mobile at a temperature above 500° C., whereas chlorine is immobile up to 900–1000° C. Thus fluorination is applicable to all metal contaminants, even though the metal is immobile. (3) Fluorine atoms can occupy the interstitial sites in Si and become negatively charged, thus tending to form a complex with positively charged interstitial iron. The formation of interstitial chlorine is not possible because of its large size. (4) In some cases a fluoride is more volatile than its corresponding chloride. For instance, the temperature required for reaching a vapor pressure of 10 torr is 171° C. for $WCl_5$ and −35° C. for $WF_6$. Therefore, W is more readily removed in fluorine than in chlorine.

The advantages of fluorination over hydrogenation are summarized as follows. (1) The chemical bond between fluorine and metals is much stronger than that between hydrogen and metals, so that the passivation by fluorination is much more stable than that by hydrogenation. (2) Hydrogenation has been reported to cause boron deactivation, while the deteriorating effect has not been observed when $BF_2$ is utilized for boron implantation. In fact the presence of fluorine has been reported to beneficially reduce boron diffusion.

DETAILED DESCRIPTION OF THE INVENTION

Figure 1:
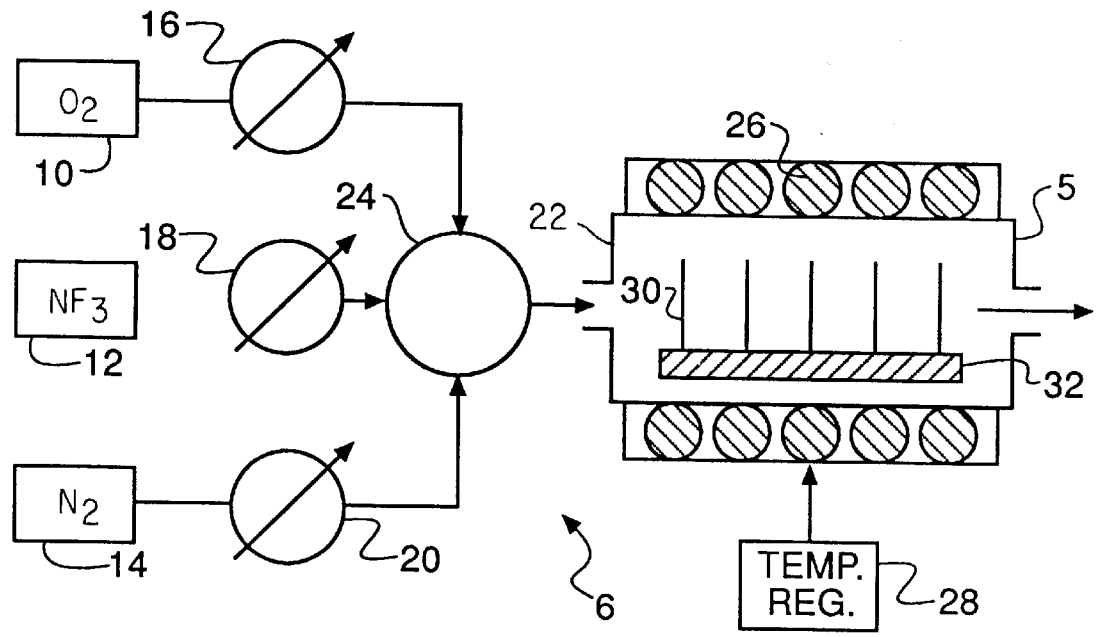
FIG. 1 is a diagram illustrating the process necessary to incorporate fluorine into a semiconductor substrate.

It has been discovered that fluorination can be used to neutralize the transition metal impurities in Si. Fluorine can be incorporated into the near-surface region of Si by implantation or annealing in a fluorine containing ambient. Thermal treatments at appropriate temperatures are used to initiate the interdiffusion and reaction between fluorine and metal contaminants. The impurities readily react with fluorine to form a compound or complex, thus significantly reducing the number of mid-gap impurities.

The advantages of fluorination over chlorination are illustrated as follows. (1) The enthalpy of a metal-fluoride is substantially greater than that of its corresponding chloride. As a result, the reaction of metal contaminants with fluorine is more thermodynamically favorable than that with chlorine, and the reaction can occur at a lower temperature and/or at a lower concentration. The enthalpy data are collected from Handbook of Chemistry and Physics and displayed in the attached Table 1. (2) Fluorine is mobile at a temperature above 500° C., whereas chlorine is immobile up to 900–1000° C. Thus fluorination is applicable to all metal contaminants, even though the metal is immobile. (3) Fluorine atoms can occupy the interstitial sites in Si and become negatively charged, thus tending to form a complex with positively charged interstitial iron. The formation of interstitial chlorine is not possible because of its large size. (4) In some cases a fluoride is more volatile than its corresponding chloride. For instance, the temperature required for reaching a vapor pressure of 10 torr is 171° C. for $WCl_5$ and −35° C. for $WF_6$. Therefore, W is more readily removed in fluorine than in chlorine.

The advantages of fluorination over hydrogenation are summarized as follows. (1) The chemical bond between fluorine and metals is much stronger than that between hydrogen and metals, so that the passivation by fluorination is much more stable than that by hydrogenation. (2) Hydrogenation has been reported to cause boron deactivation, while the deteriorating effect has not been observed when $BF_2$ is utilized for boron implantation. In fact the presence of fluorine has been reported to beneficially reduce boron diffusion.

TABLE 1

Standard Enthalpies of Fluorides and Chlorides

| Fluoride | Enthalpy (kcal/mol) | Chloride | Enthalpy (kcal/mol) |
|---|---|---|---|
| $AlF_3$ | −287.9 | $AlCl_3$ | −168.3 |
| $BaF_2$ | −288.5 | $BaCl_2$ | −205.2 |
| $CaF_2$ | −291.5 | $CaCl_2$ | −190.2 |
| $CrF_3$ | −277.0 | $CrCl_3$ | −133.0 |
| $CrF_2$ | −186.0 | $CrCl_2$ | −94.5 |
| $CoF_3$ | −193.8 | $CoCl_2$ | −74.7 |
| $CuF_2$ | −129.7 | $CuCl_2$ | −52.1 |
| $ErF_3$ | −409.0 | $ErCl_3$ | −238.7 |
| $AuF_3$ | −86.9 | $AuCl_3$ | −28.1 |
| $FeF_3$ | −242.9 | $FeCl_3$ | −95.5 |
| LiF | −147.2 | LiCl | −97.7 |
| $NiF_2$ | −160.0 | $NiCl_2$ | −72.9 |
| KF | −135.6 | KCl | −104.4 |
| AgF | −48.9 | AgCl | −30.4 |
| NaF | −137.1 | NaCl | −98.3 |
| $TaF_5$ | −455.0 | $TaCl_5$ | −205.3 |
| $VF_4$ | −335.4 | $VCl_4$ | −136.1 |
| $ZnF_2$ | −182.7 | $ZnCl_3$ | −99.2 |

A silicon wafer has metal contaminants, such as iron, nickel, chromium, titanium, tungsten, copper, sodium, and potassium. Contaminants are on the Si surface as well as in the wafer. The Si wafer is placed in a chamber with a specified pressure, temperature, and ambient. An example of such a chamber is a diffusion tube or a sintering tube used in Si processing.

Referring to FIG. 1 is a drawing illustrating a furnace 5 used within the system 6 as envisioned to practice the preferred embodiment of the present invention. The system 6 has three gas sources: an $O_2$ source 10, a $NF_3$ source 12 and a carrier source 14 which typically is a gas such as $N_2$ or $Ar_2$. The flow rate of each gas is independently adjusted by a regulator 16, 18 or 20, respectively, for each of the three sources 10, 12 and 14. The gases enter a furnace tube 22 directly or through a mixing chamber 24. The tube is surrounded by heating coils 26, and the temperature is controlled by a regulator 28. Silicon wafers 30 were stacked in a boat 32 within the furnace.

Figure 2:
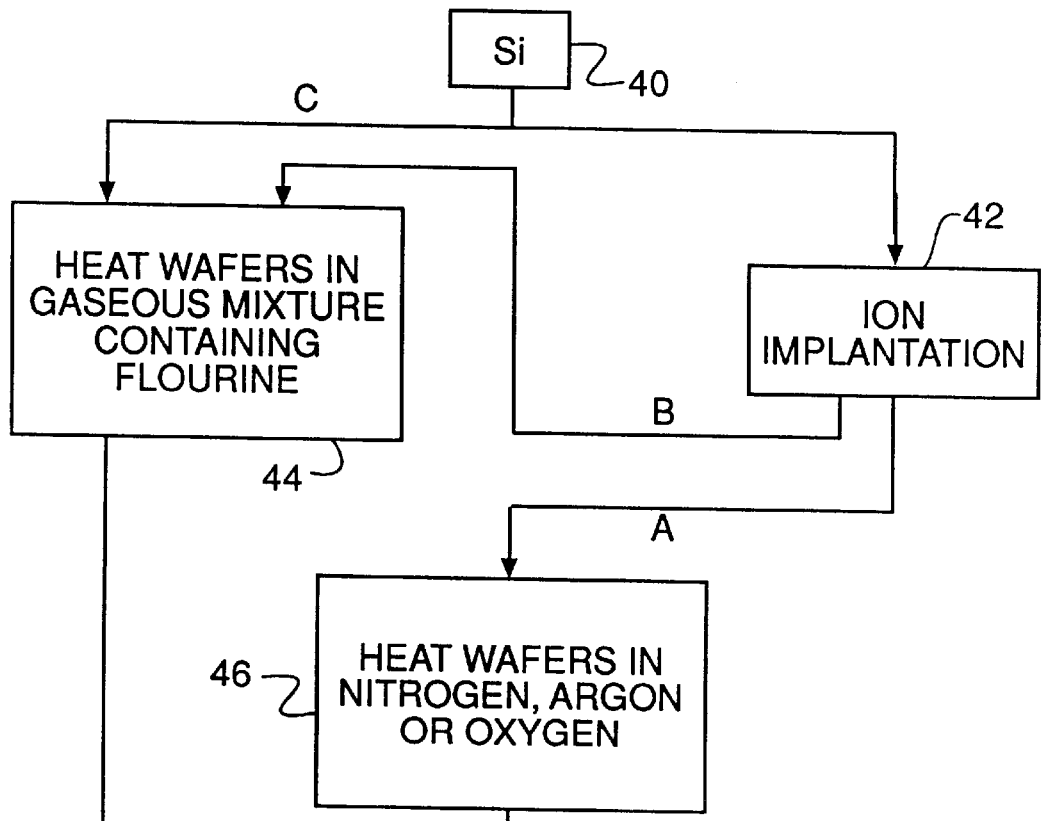
FIG. 2 is a process flow chart that illustrates options that can be employed to incorporate fluorine into the a semiconductor.

FIG. 2 shows a process path used to treat the semiconductor wafers of the present invention. There are numerous paths that may be traversed as envisioned by the present invention. A combination of ion implantation 42 and thermal annealing 46 is typically used to treat silicon wafers 40. Fluorine or fluorine compound ions (such as BF) are implanted into silicon wafers 40. After implantation Si wafers 40 are introduced into a tube furnace in an ambient of non-reactive gases ($N_2$ or $Ar_2$) as illustrated in heat wafers in nitrogen, argon or oxygen 46. Another preferred path shown in FIG. 2 is that of path B. Here, after ion implantation 42 of fluorine, a thermal treatment is done in which the wafers 40 are heated in a gaseous mixture containing fluorine 44. This again adds fluorine to the silicon wafer 40. Still another path within FIG. 2, referred to as C is to completely treat the wafers 40 by heating with gaseous mixtures containing fluorine 44.

The Si wafer is inserted into the chamber at an ambient comprised of a non-reactive or inert gas (for instance, helium, argon and nitrogen) and a fluorine compound (for instance, $NF_3$). It is desirable to use a gaseous mixture of nitrogen and $NF_3$. The ratio of nitrogen to nitrogen fluoride is (10–1000):1, preferably (100–1000):1. The wafer is ramped to a desired temperature to initiate the interdiffusion and reaction between fluorine and metal species. The temperature ranges from 400 to 900° C., preferably 500–700° C. In some cases the Si wafer is encapsulated with a silicon oxide layer with a thickness ranging from 50 to 1,000 angstroms before fluoridation.

In an alternative embodiment of the invention the fluorine is introduced in Si by ion implantation. A bare Si wafer or a Si wafer encapsulated with $SiO_2$ is placed in a vacuum chamber and irradiated with a fluorine ion beam. The dose range is from $1\times10^{12}$ ions/cm$^2$ to $1\times10^{16}$ ions/cm$^2$, preferably $1\times10^{13}$ to $1\times10^{15}$ ions/cm$^2$, at energies of 30 keV to several hundred keV. However, practical concerns may dictate using higher energies, such as in the MeV range. During implantation the wafer can be kept at room temperature or exposed to heat. After implantation, the wafer is subjected to a thermal treatment at 500–1000° C. to annihilate ion induced crystalline damage and form metal fluorides. The annealing can be carried out in vacuum or a non-reactive ambient, such as nitrogen and argon. In some cases the gaseous mixture composed of nitrogen and $NF_3$ may be used to enhance the effects of neutralization by fluorine.

EXAMPLE 1

4-inch Si p-type wafers were used as substrates. The wafers were sequentially etched in $H_2SO_4$:$H_2O_2$:$H_2O$, $NH_4OH$:$H_2O_2$:$H_2O$, diluted HF, and $HNO_3$:$H_2O_2$:$H_2O$ solutions. After a rinse in deionized water, the wafers were spun dry. The wafers were implanted with 150 kev-iron at a dose of $5\times10^{12}$/cm$^2$, and then rapidly heated in nitrogen at 1000° C. for 5 min. The iron species was distributed uniformly in Si and largely occupies the interstitial sites in Si. Deep level transient spectroscopy (DLTS) was used to determine the interstitial iron. The wafers were further treated in a sintering tube at 500–700° C. for 30 min. Nitrogen and nitrogen fluoride were separately introduced into the furnace at respective flow rates. The resulting ambient was comprised of 0.1% to 5% nitrogen fluoride and the balance nitrogen. The heat-treatment promoted interdiffusion between fluorine and metal contaminants, thus forming either volatile metal fluorides or stable compound in Si. DLTS was employed to determine the change in interstitial iron before and after fluorination. It should be noted that before DLTS analysis the wafers were heated at 200° C., and then cooled to room temperature by quenching. The quenching was done by placing the wafer in water. The low temperature anneal followed by fast cooling ensured decomposition of possible iron-boron pairs.

EXAMPLE 2

The same Si substrates and processing procedures were employed as described in Example 1, except that fluorine was introduced by ion implantation. Iron-implanted and rapidly annealed Si wafers were implanted with fluorine at 150 keV and a dose ranging from $5\times10^{13}$ ions/cm$^2$ to $5\times10^{14}$ ions/cm$^2$. The wafers were further treated in a sintering tube at 600–900° C. in $N_2$ for 30 min to annihilate ion induced crystalline damage and form metal fluorides. DLTS was employed to determine the change in interstitial iron before and after fluorination.

While the above examples have illustrated the embodiments most preferred by the inventors, other variation are envisioned. The semiconductors discussed above employed silicon (Si). However, other semiconductors such as germanium (Ge), a combination of Si and Ge (SiGe), or gallium-arsenide (GaAs) can be used as the semiconductor material.

The invention has been described with reference to a preferred embodiment. However, it will be appreciated that variations and modifications can be effected by a person of ordinary skill in the art without departing from the scope of the invention.

Parts List 5 furnace
6 system
10 $O_2$ source
12 $NF_3$ source
14 $N_2$ source
16 $O_2$ source regulator
18 $NF_3$ source regulator
20 $N_2$ source regulator
22 furnace tube
24 mixing chamber
26 heating coils
26 temperature regulator
30 silicon wafers
32 boat
40 silicon wafers prior treatment
42 fluorine treatment via ion implantation
44 fluorine treatment via gaseous mixture
46 heat treatment of wafer

We claim:

1. A method of neutralizing transition metal defects within semiconductors comprising the steps of:

providing a semiconductor substrate with a surface containing etched circuitry;

placing the semiconductor substrate containing etched circuitry into a chamber;

neutralizing transition metal impurities in the semiconductor substrate containing etched circuitry by incorporating fluorine into the surface of the semiconductor substrate; and thermally treating the semiconductor substrate containing etched circuitry at predetermined temperatures within a range of 400–900° C. to initiate interdiffusion and reaction between fluorine and metal impurities at the surface of the semiconductor substrate.

2. The method of claim 1 wherein the neutralization of transition metal impurities within the semiconductor substrate is by either one of the following processes: implantation; or annealing within a flourine containing ambient.

3. The method of claim 2 wherein the neutralization process is by annealing, and fluorine is incorporated into the semiconductor substrate via a mixture of an inert gas and fluorine based compound.

4. The method of claim 3 wherein the inert gas is nitrogen (N).

5. The method of claim 4 wherein the fluorine based compound is nitrogen fluoride ($NF_3$).

6. The method of claim 5 wherein a ratio of nitrogen to nitrogen fluoride is within the range of between 10–1000 parts nitrogen to 1 part nitrogen fluoride.

7. The method of claim 1 wherein the semiconductor substrate is selected from one the following: silicon; germanium; a combination of silicon and germanium; or gallium-arsenide.

8. The method of claim 3 wherein the step of thermally treating further comprises thermally treating within the temperature range of between 500–700° C.

9. The method of claim 1 wherein the neutralization process is accomplished by ion implantation within surface of the semiconductor substrate via a fluorine ion beam.

10. The method of claim 9 wherein the implanted doses are within the range of between $1*10^{12}$ ions/cm$^2$ and $1*10^{16}$ ions /cm$^2$.

11. The method of claim 9 wherein the step of thermally treating further comprises thermally treating in the temperature range between 500–700° C.

* * * * *